US008375744B2

(12) United States Patent
Becken et al.

(10) Patent No.: US 8,375,744 B2
(45) Date of Patent: *Feb. 19, 2013

(54) HERMETICALLY SEALED GLASS PACKAGE AND METHOD OF MANUFACTURE

(75) Inventors: Keith James Becken, Bath, NY (US); Stephan Lvovich Logunov, Corning, NY (US); Aiyu Zhang, Mason, OH (US); John Bayne, Elmira, NY (US)

(73) Assignee: Corning Incorporated, Corning, NY (US)

( * ) Notice: Subject to any disclaimer, the term of this patent is extended or adjusted under 35 U.S.C. 154(b) by 1293 days.

This patent is subject to a terminal disclaimer.

(21) Appl. No.: 11/992,370

(22) PCT Filed: Nov. 27, 2006

(86) PCT No.: PCT/US2006/045479
§ 371 (c)(1),
(2), (4) Date: Mar. 21, 2008

(87) PCT Pub. No.: WO2007/067384
PCT Pub. Date: Jun. 14, 2007

(65) Prior Publication Data
US 2010/0126898 A1   May 27, 2010

Related U.S. Application Data

(60) Provisional application No. 60/748,300, filed on Dec. 6, 2005.

(51) Int. Cl.
*C03B 23/20* (2006.01)
*C03B 23/24* (2006.01)
(52) U.S. Cl. .......................................................... 65/36
(58) Field of Classification Search .................. 65/36
See application file for complete search history.

(56) References Cited

U.S. PATENT DOCUMENTS

| 6,416,375 B1 | 7/2002 | Cho et al. |
| 6,517,403 B1 | 2/2003 | Cooper et al. |

(Continued)

FOREIGN PATENT DOCUMENTS

| JP | 2001-319775 | 11/2001 |
| JP | 2002-137939 | 5/2002 |

(Continued)

OTHER PUBLICATIONS

US Non-Final Office Action, U.S. Appl. No. 12/393,538, Applicant: Andrew Lawrence Russell et al., Notification Date: Aug. 25, 2011.

(Continued)

*Primary Examiner* — Matthew Daniels
*Assistant Examiner* — Cynthia Szewczyk
(74) *Attorney, Agent, or Firm* — Thomas R. Beall

(57) ABSTRACT

A method for manufacturing a hermetically sealed package is provided, the method comprising the steps of: using a laser to heat a frit, disposed in a pattern between two substrates, such that the heated frit forms a hermetic seal which connects the substrates and further comprising: directing the laser to enter the frit pattern, then to trace the frit pattern, then to retrace a portion of the frit pattern, and then to exit the frit pattern; and selecting an initial laser power which, when the laser enters the frit pattern, is insufficient to heat the frit to form a hermetic seal; then increasing the laser power over a first section of the frit pattern to a target laser power at least sufficient to heat the frit to form a hermetic seal; and then decreasing the laser power over a second section of the frit pattern until the laser power is insufficient to heat the frit to form a hermetic seal before the laser exits the frit pattern.

8 Claims, 7 Drawing Sheets

U.S. PATENT DOCUMENTS

| | | |
|---|---|---|
| 6,586,087 B2 | 7/2003 | Young |
| 6,998,776 B2 | 2/2006 | Aitken et al. |
| 7,602,121 B2 | 10/2009 | Aitken et al. |
| 2001/0038365 A1 | 11/2001 | Igeta .............................. 345/60 |
| 2003/0222061 A1 | 12/2003 | Langer et al. |
| 2004/0206953 A1 | 10/2004 | Morena et al. |
| 2004/0207314 A1 | 10/2004 | Aitken et al. |
| 2006/0082298 A1 | 4/2006 | Becken et al. |
| 2006/0084348 A1 | 4/2006 | Becken et al. |
| 2007/0128967 A1 | 6/2007 | Becken et al. |
| 2007/0286973 A1 | 12/2007 | Sawai et al. |
| 2009/0221207 A1 | 9/2009 | Russell et al. |
| 2010/0129666 A1 | 5/2010 | Logunov et al. |
| 2010/0304513 A1 | 12/2010 | Nguyen et al. |
| 2011/0135857 A1 | 6/2011 | Logunov et al. |
| 2011/0198986 A1 | 8/2011 | Kuromiya et al. |

FOREIGN PATENT DOCUMENTS

| | | |
|---|---|---|
| JP | 2002-163977 | 6/2002 |
| JP | 2003-332061 | 11/2003 |
| WO | WO 2004/095597 | 4/2004 |

OTHER PUBLICATIONS

Response to US Non-Final Office Action, U.S. Appl. No. 12/393,538, Applicant: Andrew Lawrence Russell et al., Receipt Date: Nov. 22, 2001.

US Non-Final Office Action, U.S. Appl. No. 12/393,538, Applicant: Andrew Lawrence Russell et al., Notification Date: Jan. 30, 2012.

Response to US Non-Final Office Action, U.S. Appl. No. 12/393,538, Applicant: Andrew Lawrence Russell et al., Receipt Date: Apr. 30, 2012.

US Final Office Action, U.S. Appl. No. 12/393,538, Applicant: Andrew Lawrence Russell et al., Receipt Date: Jun. 6, 2012.

US 8,375,744 B2

HERMETICALLY SEALED GLASS PACKAGE AND METHOD OF MANUFACTURE

CROSS REFERENCE TO RELATED APPLICATIONS

This application claims the benefit under 35 USC §119(e) of U.S. Provisional Application No. 60/748,300, filed on Dec. 6, 2005.

BACKGROUND OF THE INVENTION

1. Field of the Invention

The present invention relates to hermetically sealed glass packages that are suitable to protect thin film devices which are sensitive to the ambient environment. Some examples of such glass packages are organic light emitting diode (OLED) displays, sensors, photovoltaics and other optical devices. The present invention is demonstrated using an OLED display as an example.

2. Description of Related Art

OLEDs have been the subject of a considerable amount of research in recent years because of their use and potential use in a wide variety of electroluminescent devices. For instance, a single OLED can be used in a discrete light emitting device or an array of OLEDs can be used in lighting applications or flat-panel display applications (e.g., OLED displays). OLED displays are known to be very bright and to have a good color contrast and wide viewing angle. On the other hand, however, OLED displays, and in particular the electrodes and organic layers located therein, are susceptible to degradation resulting from interaction with oxygen and moisture leaking into the OLED display from the ambient environment. The life of an OLED display can be significantly increased if the electrodes and organic layers located therein are hermetically sealed from the ambient environment. Unfortunately, it has been very difficult to develop a sealing process to hermetically seal the OLED display. Some of the factors that have made it difficult to properly seal the OLED display are briefly mentioned below:

The hermetic seal should provide a barrier for oxygen ($10^{-3}$ cc/m$^2$/day) and water ($10^{-6}$ g/m$^2$/day);

The hermetic seal should survive mechanical shocks, such as those generated when a cell phone falls to the ground, received during the use of the display;

The width of the hermetic seal should be small (e.g., <2 mm) so that it does not have an adverse effect on the size of the OLED display;

The temperature generated during a sealing process should not damage the materials (e.g., electrodes and organic layers) within the OLED display. For instance, in a typical OLED display, the first pixels of OLEDs are located close to the hermetic seal and should not be heated to more than about 85-100° C. during the sealing process;

Any gases released during the sealing process should not contaminate the materials within the OLED display; and The hermetic seal should enable electrical connections (e.g., thin-film electrodes) to enter the OLED display.

Today, one way to seal the OLED display is to form a hermetic seal by softening a low temperature frit doped with a material that is highly energy absorbent at a specific wavelength of light to bond two substrate plates together. In particular, the frit is deposited on a substrate plate in a closed pattern, hereinafter the "frit pattern", and a laser is used to heat up and soften the frit which forms a hermetic seal between the substrate plate or cover glass plate with the frit located thereon and a substrate plate or glass plate with OLEDs located thereon.

A problem which can occur in an OLED formed by the conventional laser heating of frit is the creation of residual stress, i.e., stresses remaining in the seal after the seal has cooled, in the frit seal at the location where the laser enters/exits the frit pattern during sealing, i.e., the frit pattern entry/exit point(s). This residual stress can lead either to a non-hermetic seal, resulting in an unusable product, or to premature failure of the seal, resulting in premature failure of the display. There is thus a need for a method of sealing a glass package which does not suffer from residual stress located at frit pattern entry/exit points. This need is satisfied by using one or more of the sealing techniques of the present invention.

BRIEF SUMMARY OF THE INVENTION

The present invention includes a hermetically sealed OLED display and methods for manufacturing hermetically sealed OLED displays. Basically, the hermetically sealed OLED display of the present invention is manufactured by providing a first substrate plate and a second substrate plate. OLEDs are deposited onto the first substrate plate, and a frit is deposited onto the second substrate plate to form a frit pattern 108. After positioning the first and second substrate plates so that the frit is located between them, a laser is used to heat the frit and soften it sufficiently to bond it to the first and second substrate plates and form a hermetic seal that connects the first and second substrate plates and protects the OLEDs. For the sake of clarity, the concept of "heating the frit to soften it sufficiently to bond it to the first and second substrate plates" is hereinafter simply referred to as "softening the frit", "the frit being softened" or the like. The frit is glass that has been doped with at least one transition metal, or other inorganic energy absorbing component, and optionally a CTE lowering filler, such that the laser, when trained onto the frit, is absorbed by the frit so that the frit softens and forms bonds with the substrate plates. This causes the frit to form the hermetic seal, while avoiding thermal damage to the OLEDs, by directly heating only the frit, and not the whole OLED package. The laser path and power, or power profile, are controlled in the present invention in order to avoid the creation of residual stresses in the hermetic seal. Thus, the laser path is controlled such that the laser enters or is trained onto the frit pattern, traces the frit pattern, retraces a portion of the frit pattern, and then exits the frit pattern. The laser power is controlled such that 1) the laser enters the frit pattern with a laser power which is insufficient to cause the frit to form a hermetic seal connecting the two substrate plates; 2) the laser power is increased as the laser traces the frit pattern until a target laser power, sufficient to cause the frit to form a hermetic seal connecting the two substrate plates, is reached; and 3) the laser power is then decreased at a selected location on the frit pattern to a laser power which is insufficient to cause the frit to form a hermetic seal connecting the two substrate plates before the laser exits the frit pattern.

It should be noted that in the present application phrases such as "laser power which is insufficient to cause the frit to form a hermetic seal" and the like are intended to mean that the laser power is insufficient to cause the frit to form a hermetic seal in a single pass of the laser. Two passes of a laser having a "laser power which is insufficient to cause the frit to form a hermetic seal" may impart sufficient heat to the frit to cause the frit to form a hermetic seal. In the present invention, where two passes of a laser having a "laser power which is insufficient to cause the frit to form a hermetic seal" are described, it is intended that the additive energy imparted to the frit by the two passes is sufficient to, and in fact does, cause the frit to form a hermetic seal.

BRIEF DESCRIPTION OF THE DRAWINGS

A more complete understanding of the present invention may be obtained by reference to the following detailed description when taken in conjunction with the accompanying drawings wherein.

DETAILED DESCRIPTION OF THE INVENTION

Figure 3:
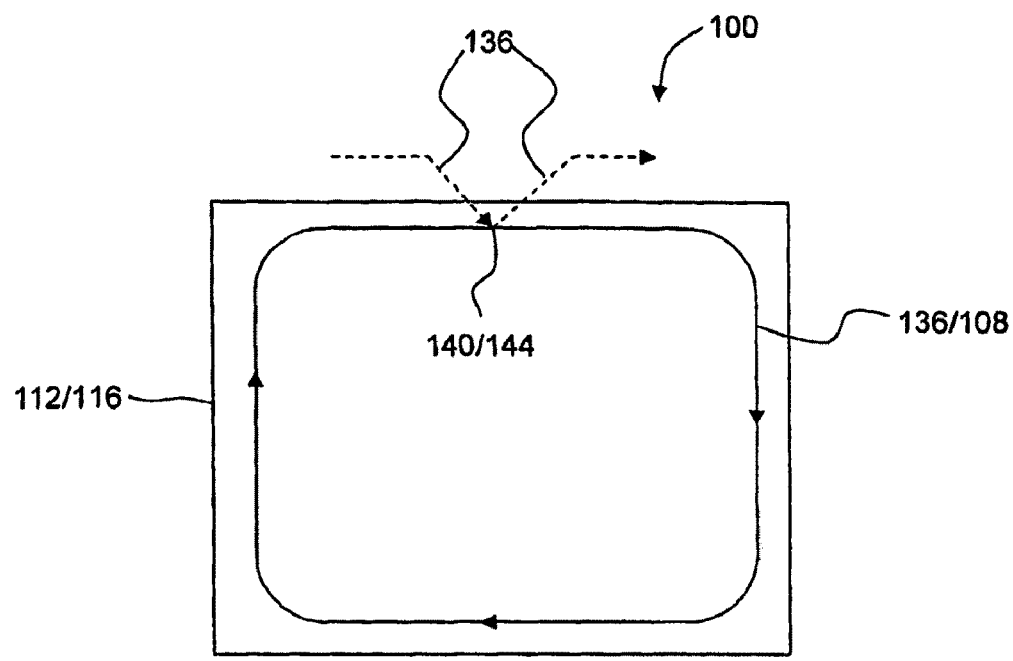
FIG. 3 is a plan view of a glass package used to describe a prior art method of sealing a glass package using doped frit.

FIG. 3 illustrates a method of sealing a glass package which does not incorporate the novel aspects of the present invention. In this method, the laser 132 is directed along a laser path 136 which enters and exits the frit pattern at the same location 306. The laser power is not controlled in the sense that it is not varied; rather it is set at a power which causes the frit to soften and form a hermetic seal connecting the two substrate plates.

Figure 1:
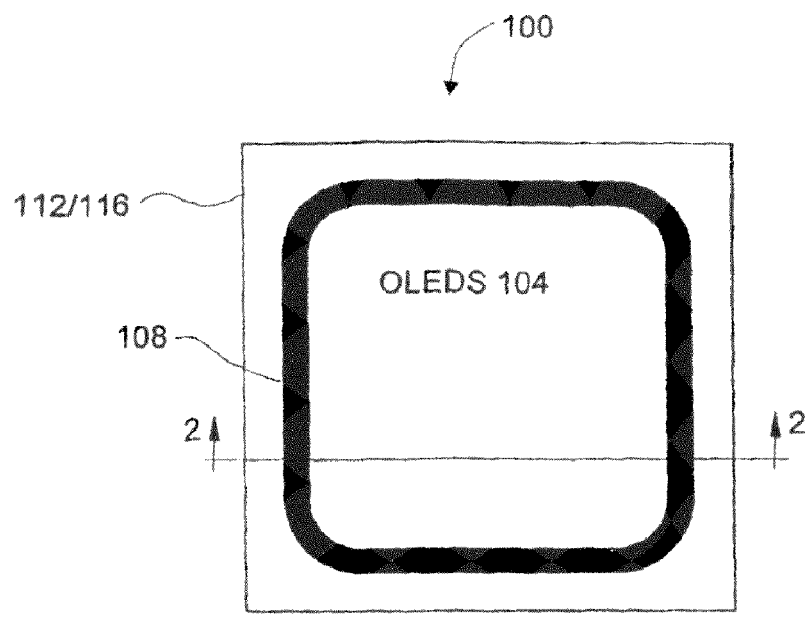
FIGS. 1 and 2 are a plan view and a cross-sectional side view illustrating the basic components of a hermetically sealed OLED display in accordance with the present invention.
Figure 2:
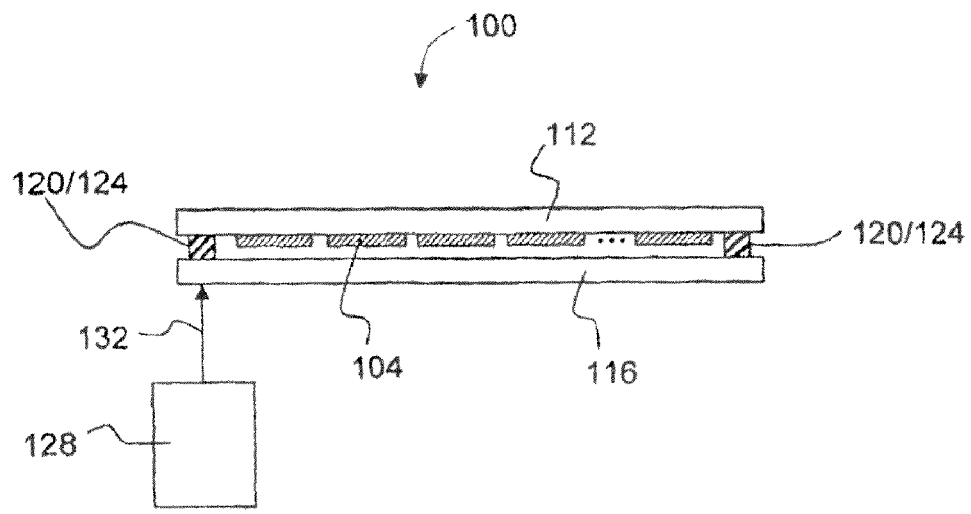

Referring to FIGS. 1 and 2 there is disclosed a hermetically sealed OLED display 100 made in accordance with a first embodiment of the present invention. Although the sealing process of the present invention is described below with respect to the fabrication of a hermetically sealed OLED display 100, it should be understood that the same or similar sealing process can be used in other applications where two glass plates need to be sealed to one another. Accordingly, the present invention should not be construed in a limited manner.

FIGS. 1 and 2 show a plan view and a cross-sectional side view illustrating the basic components of a hermetically sealed OLED display 100, and the laser generator 128 and laser 132 used to seal the OLED device. The OLED display 100 includes a multilayer sandwich of a first substrate plate 112, an array of OLEDs 104, a doped frit 120 deposited in a closed frit pattern 108 and a second substrate plate 116. Following application of the method of the present invention, the OLED display 100 has a hermetic seal 124 formed from the frit 120 which protects the OLEDs 104 located between the first substrate plate 112 and the second substrate plate 116 (e.g., glass plates 112 and 116). The hermetic seal 124 is typically located around the perimeter of the OLED display 100, and the OLEDs 104 are located within a perimeter of the hermetic seal 124. How the hermetic seal 124 is formed from the frit 120 and the ancillary components such as the laser generator 128 are described in greater detail below.

In one embodiment of the present invention, the first and second substrate plates 112 and 116 can be transparent glass plates like the ones manufactured and sold by Corning Incorporated under the brand names of Code 1737™ glass or Eagle 1120™ glass. Alternatively, the first and second substrate plates 112 and 116 can be transparent glass plates like the ones manufactured and sold by companies such as, e.g., Asahi Glass Co. (e.g., OA10 glass and OA21 glass), Nippon Electric Glass Co., NH Techno and Samsung Corning Precision Glass Co. It is highly desirable in the OLED application for the first and second glass plates to have the same CTE, coefficient of thermal expansion, or little difference in CTE.

The OLEDs 104 and other circuitry are deposited onto the first substrate plate 112. The typical OLED 104 includes an anode electrode, one or more organic layers and a cathode electrode (not shown). However, it should be readily appreciated by those skilled in the art that any known OLED 104 or future OLED 104 can be used in the OLED display 100. Again, it should be appreciated that this step of depositing OLED and other circuitry can be skipped if an OLED display 100 is not being made but instead a non-OLED glass package is being made using the sealing process of the present invention.

The frit 120 is typically deposited on the second substrate plate 116 to form a fit pattern 108. For instance, the frit 120 can be placed approximately 1 mm away from the edges of the second substrate plate 116. In one embodiment, the frit 120 is a low melting temperature glass frit that contains one or more laser energy absorbing species chosen from the group including, e.g., iron, copper, vanadium, and neodymium, or others. The frit 120 may also be doped with a filler, or CTE filler (e.g., an inversion filler or an additive filler), which modifies the coefficient of thermal expansion of the frit 120 so that it matches or substantially matches the coefficient of thermal expansions of the two substrate plates 112 and 116. Matching CTE can be important to avoid cooling induced stresses in the resulting seal. The compositions of several exemplary frits 106 are provided below in TABLE 1.

The present invention may be used with any frit that is currently known, or yet to be discovered, to be suitable for the laser sealing of hermetic glass packages In an optional step, the frit 120 can be pre-sintered on the second substrate plate 116. To accomplish this, the frit 120 which has been deposited onto the second substrate plate 116 is heated so that it sinters and becomes attached to the second substrate plate 116.

Substrate plates 112 and 116 are then arranged such that the frit which has been deposited on substrate plate 116 contacts both substrate plates. The frit 120 is then heated by the laser 132 in a manner (which is described in more detail below) such that the frit 120 forms the hermetic seal 124 which connects and bonds the first substrate plate 112 to second substrate plate 116 (see FIG. 2). In addition to bonding the first substrate plate 112 to the second substrate plate 116, the hermetic seal 124 also protects the OLEDs 104 by preventing oxygen and moisture in the ambient environment from entering into the OLED display 100. As shown in FIGS. 1 and 2, the hermetic seal 124 is typically located just inside the edges of the finished OLED display 100.

Figure 4:
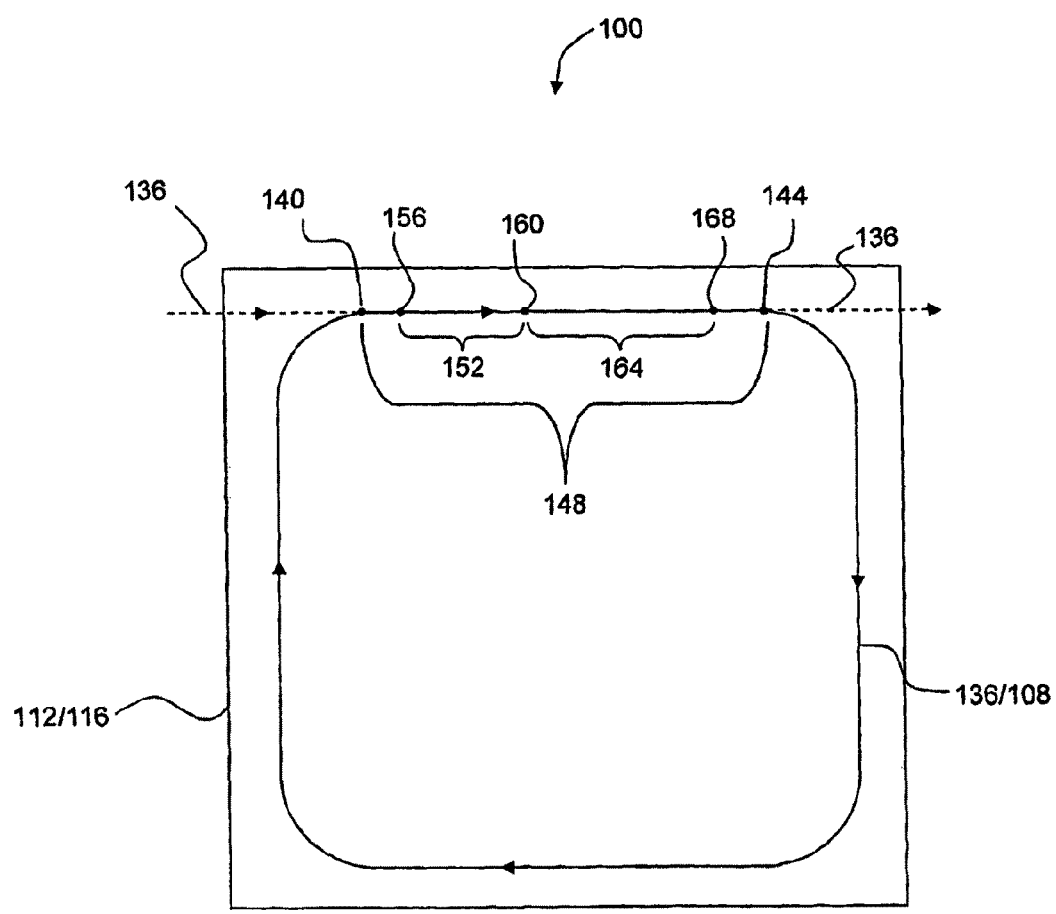
FIG. 4 is a plan view of a glass package used to describe a first embodiment of the present invention.
Figure 5:
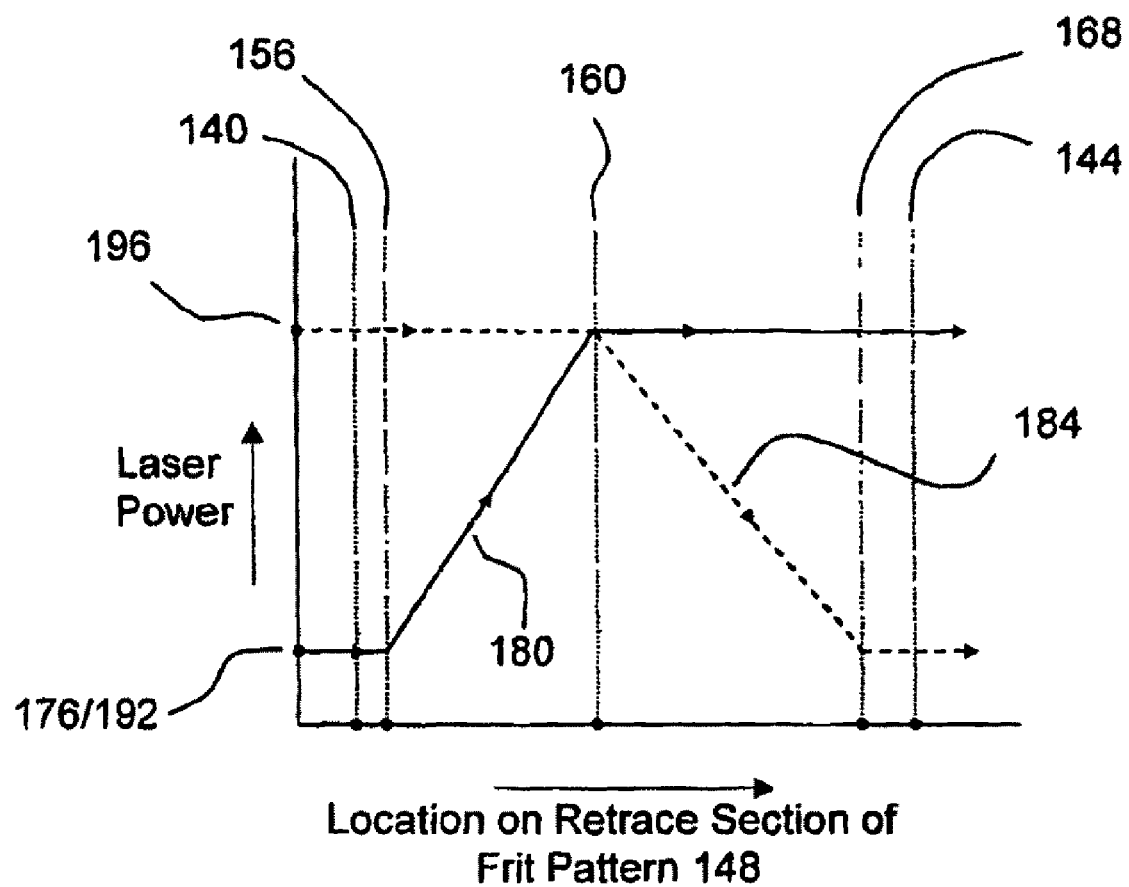
FIG. 5 is a graphical illustration which shows the relationship of laser power and laser position on a portion of the frit pattern for the first embodiment of the present invention shown in FIG. 4.

FIGS. 4 and 5 illustrate additional steps which provide hermeticity and seal strength benefits of one embodiment of the present invention.

FIG. 4 shows a top view of the OLED device where the first substrate 112 has been laid over the second substrate 116 such that the frit 120 which forms frit pattern 108 is sandwiched between the substrate plates 112/116. This figure is used to illustrate two aspects of the current invention: laser path control and laser power control.

The laser 132 which heats the frit is controlled such that the laser follows a path 136 which advantageously begins outside the frit pattern 108, but which can begin inside the frit pattern 108. Thus, for example, in FIG. 4 the path of the laser 132 is denoted by the number 136. The dashed line portions of the laser path 136 are the portions of the laser path 136 which lie off of the frit pattern 108, while the solid line portion of the path corresponds to the portion of the laser path which coincides with the fit pattern 108. The laser enters the frit pattern at a frit pattern entry location 140, traces the entire frit pattern, retraces a portion of the pattern, and finally exits the frit pattern at a frit pattern exit location 144. The portion of the frit pattern which falls between the frit pattern entry location 140 and the frit pattern exit location 144 is traced twice, and is referred to herein as "the portion of the frit pattern which is retraced" 148 or the like. Although the frit entry location 140 and the frit exit location 144 are advantageously shown in FIG. 4 to be located such that the retrace portion of the frit pattern 148 is a straight line and encompasses one entire side of the frit pattern 108, it should be understood that the frit pattern entry location 140 and the frit pattern exit location 144 can be located such that the retrace portion of the frit pattern 148 may encompass more or less of the fit pattern than one full side of the frit pattern 108, and may encompass a corner or other non-straight portion of the frit pattern 148.

In addition to controlling the path of the laser 132, the method of the present invention includes controlling the energy which is imparted to the frit from the laser 132, or, in other words, controlling the heating of the frit. The amount of energy which is imparted to or absorbed by the frit can be controlled by changing one or more of several parameters, including, but not limited to, the translational speed of the laser spot as it traces the fit (where the laser spot is defined as the intersection between the laser 132 and the fit pattern), the wattage of the laser 132, the size of the laser spot, the shape of the laser spot and by masking the frit. To facilitate the description of the present invention, "controlling the energy imparted to, and thereby absorbed by, the frit" is referred to herein as "controlling the laser power", but this should not be construed as being limited to controlling the wattage of the laser, which, though advantageous, is only one means of controlling the energy imparted to, and absorbed by, the frit.

Referring to FIGS. 4 and 5, the method of the present invention also includes controlling the laser power so that when the laser 132 enters the frit pattern 140, the laser power is insufficient to cause the frit to form a hermetic seal connecting the two substrate plates. This insufficient laser power state includes the zero power state, where the laser generator 128 is turned off. Subsequent to entering the frit pattern 108 at frit pattern entry point 140, and during the first trace over the retrace portion 148 of the frit pattern, the laser power is increased over a ramp up section 152, until the laser power reaches a selected target power such that it is sufficient to cause the frit to form a hermetic seal connecting the two substrate plates in one pass. This ramp up section 152 begins at a frit pattern location where the laser power is first increased 156, and ends at frit pattern location where target laser power is reached 160. Advantageously, the length of ramp up section 152 is at least about 3 mm and, advantageously is at least about 10 mm.

The target power can be defined as a laser power which is sufficient to soften the frit 120 in one pass sufficiently so that it wets both substrate plates 112/116, but which laser power is insufficient to cause undesirable heating of the substrate glasses 112/116 or the OLEDs 104 attached thereto. Therefore, target power can be selected from a range of laser powers. Target power can also be defined as a laser power which is sufficient to cause the frit to form a hermetic seal and connect the two substrate plates in one pass of the laser, but which is insufficient to cause undesirable heating of the substrate glasses or the OLEDs attached thereto. Advantageously, this laser power is the minimum laser power required to consistently cause the frit to form a hermetic seal. This range can easily be determined, for example, by varying the laser power until consistent wetting is obtained without causing damage the substrate glasses or OLEDs.

In this embodiment of the invention, once the target power is reached, the laser 132 continues to trace the frit pattern 108 at one or more selected target powers until it reaches the frit pattern location at which the laser power first reached target power 160, whereupon the laser power is decreased over a ramp down section 164, until the laser power reaches a selected power which is insufficient to cause the frit to form a hermetic seal. The ramp down section of the frit pattern 164 begins at frit pattern location 160 where the laser power first reached target power on the first trace, and where the laser power is first reduced below target power on the second trace, and ends at frit pattern location 168 where the laser power is reduced to a selected power insufficient to cause the frit to form a hermetic seal in a single pass. Advantageously, the length of the ramp down section 164, i.e. the distance over which the laser power is decreased from the target power to a selected power insufficient to cause the frit to form a hermetic seal, is at least about 5 mm, and advantageously at least about 7 mm and more advantageously at least about 10 mm. The laser 132 then exits the frit pattern 144.

Figure 7:
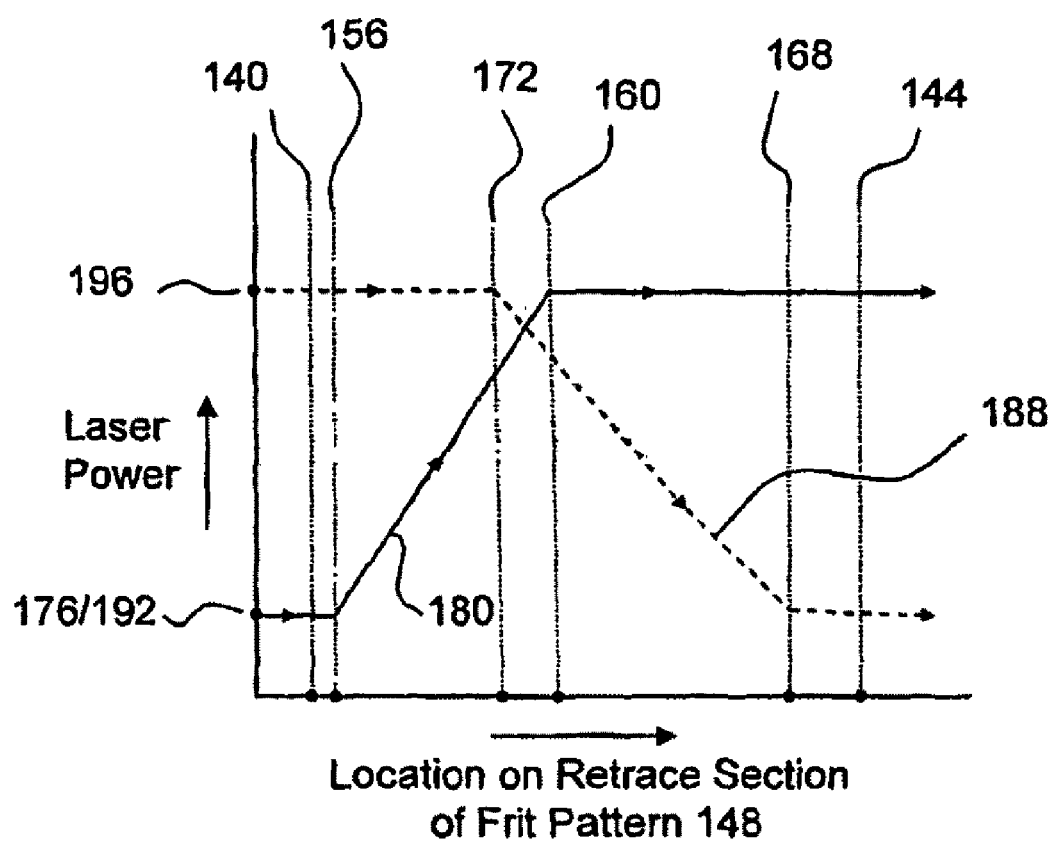
FIG. 7 is a graphical illustration which shows the relationship of laser power and laser position on a portion of the frit pattern for the second embodiment of the present invention shown in FIG. 6.

Laser power control in this embodiment of the invention is further illustrated in FIG. 5 which plots laser power as a function of the position of the laser 132 on the frit pattern. As described above with reference to FIG. 4, the laser 132 enters the frit pattern 108 at frit pattern entry point 140, traces the entire frit pattern 108, then begins retracing the fit pattern 108 at frit entry point 140 and then finally exits the frit pattern 108 at frit pattern exit point 144. This graph depicts laser power during the first and second traces of the laser 132 over the retrace portion of the frit pattern 148. The solid line 180 depicts the laser power profile during the first trace, including the ramp up between frit pattern locations 156 and 160, and the dashed line 184 depicts the laser power during the second trace, including the ramp down between frit pattern locations 160 and 168. As the laser 132 enters the fit pattern 140 the laser power is maintained at a selected power insufficient to cause the frit to form a hermetic seal. Starting at the frit pattern location at which laser power is first increased 156, the laser power is increased until the laser 132 reaches the frit location 160 at which the laser power reaches target power 192. Note that laser power can be increased immediately upon entering the frit pattern, and in this case frit pattern locations 140 and 156 would coincide. After the laser 132 completes the first trace of the frit pattern 108 it begins to retrace the frit pattern 108 at the frit pattern entry 140. Then as the laser 132 reaches the frit location 160 at which the laser power first reached target power 192, the laser power is gradually reduced to a second selected laser power which is insufficient to cause the frit to form a hermetic seal in a single pass, at frit pattern location 168. Note that the first and second selected laser powers (176 and 192) which are insufficient to cause the frit can be the same (as depicted in FIGS. 5 and 7) or different. The laser 132 then leaves the frit pattern 108 at frit pattern exit location 144. Note that the laser 132 can exit the frit pattern at the same point at which laser power reaches the selected laser power which is insufficient to soften the frit and in this case frit pattern locations 168 and 144 would coincide.

The profile of the laser power during the first trace of the retrace portion 148 of the frit pattern 180 is advantageously depicted in FIG. 5 as having a linear increase.

The invention should not be construed as limited to a linear increase, however. Any profile can be used so long as it comprises a gradual change, i.e., the heating rate of the frit vs. distance does not exceed about 100° C./m A second embodiment of the invention, illustrated in FIGS. 6 and 7 differs from the first embodiment illustrated in FIGS. 4 and 5, in the following manner:

In the first embodiment, the frit pattern location at which target power is first reached and the location at which the laser power is first decreased are the same location, described as a "zero overlap" of target laser power, where the ramp up section and the ramp down section do not overlap. In the second embodiment, the ramp up section begins at frit pattern location 156 and ends at frit pattern location 160, while the ramp down section begins at frit pattern location 172 and ends at frit pattern location 168, resulting in an overlap of the ramp up section and the ramp down section between frit pattern locations 172 and 160. This overlap creates a portion of the frit pattern over which the laser 132 was not at target power during either of the first or second traces. This overlap is graphically represented in FIG. 7.

Figure 6:
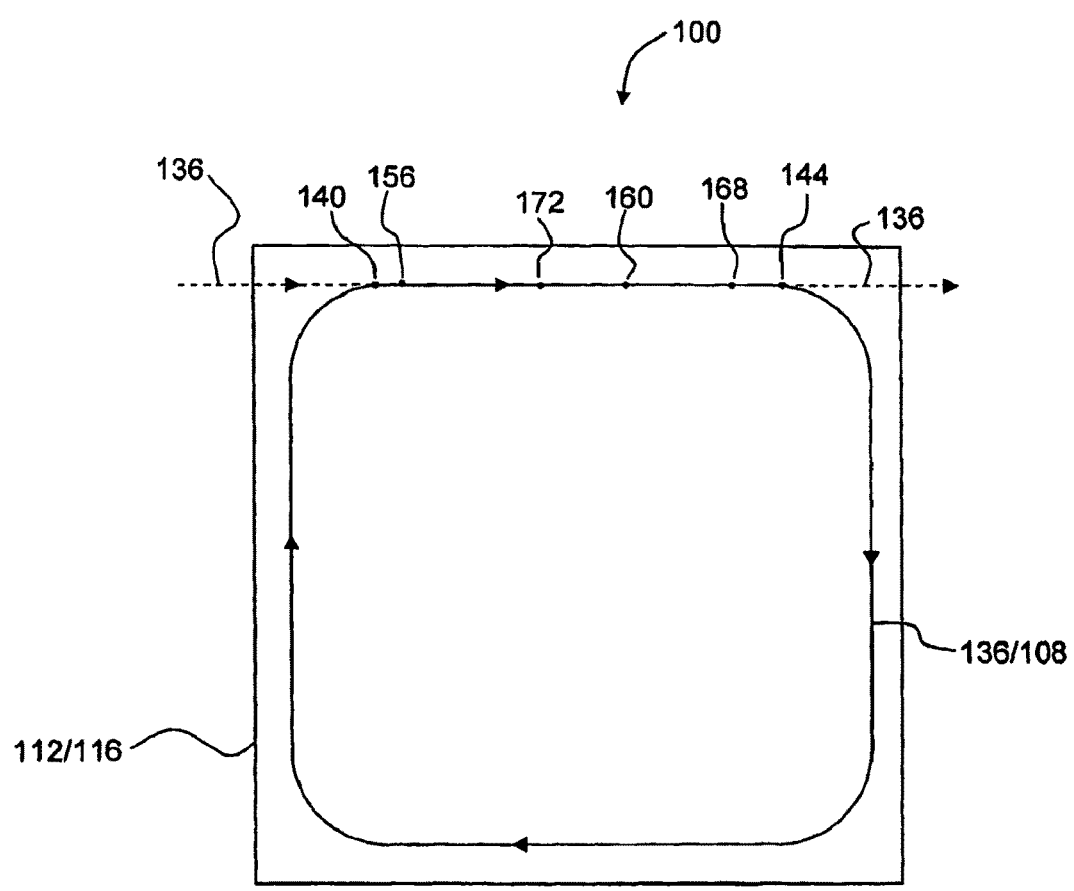
FIG. 6 is a plan view of a glass package used to describe a second embodiment of the present invention.

Thus, for example, in FIG. 6 the path of the laser 132 is denoted by the number 136. The dashed line portions of the laser path 136 are the portions of the laser path 136 which lie off of the frit pattern 108, while the solid line portion of the path corresponds to the laser path where it coincides with the frit pattern 108.

Laser 132 enters the frit pattern 140 with a selected laser power which is insufficient to cause the frit to form a hermetic seal. The laser power is then increased beginning at frit location 156 until the laser power reaches a selected target power at frit pattern location 160. The laser then continues to trace the frit pattern 108 at one or more selected target powers, until it passes frit location 156 and reaches frit pattern location 172 whereupon the laser power is decreased until it reaches a selected power which is insufficient to cause the frit to form a hermetic seal at frit location 168. Advantageously, the distance between frit locations 172 and 168 over which the laser power is decreased from the target power to a selected power insufficient to cause the fit to form a hermetic seal is at least about 5 mm.

The laser 132 then exits the frit 144. The section of the frit pattern 108 which is located between frit locations 172 and 160 is the overlap section of the frit pattern 108 which is at no time traced at target power. It should be noted that while the order of the numbered frit locations is accurately depicted in FIG. 6, the distances between the numbered frit locations are not drawn to scale and it is within the scope of the present invention to vary the distances.

Control of the laser power in this embodiment of the invention is further illustrated in FIG. 7 which plots laser power as a function of the position of the laser 132 on the retrace section of the frit pattern 148. The solid line 180 depicts the laser power profile during the first trace, including the ramp up section between frit pattern locations 156 and 160, and the dashed line 188 depicts the laser power profile during the second trace, including the ramp down section located between frit pattern locations 172 and 168. As the laser 132 enters the pattern at the frit pattern entry location 140 the laser power is at a first selected power insufficient to cause the frit to form a hermetic seal 176. The laser power is then gradually increased beginning at frit pattern location 156 until the laser 132 reaches the selected target power 192 at frit pattern location 160. The laser 132 continues to trace the frit pattern 108 (not shown). After the laser 132 completes the first trace of the frit pattern 108 it begins to retrace the frit pattern 108 as depicted by dashed line 188. Then, after the laser 132 passes the frit pattern location 156, at which the laser power was first increased, but prior to reaching frit pattern location 160, at which the selected target power was first reached, the laser power is decreased, beginning at frit location 172. The laser power is reduced between frit location 172 and 168 to a second selected laser power which is insufficient to soften the frit 192. Note that the first and second selected laser powers 176 and 192 which are insufficient to soften the frit may be the same, as depicted in FIG. 7, or different. The laser 132 then leaves the frit pattern 108 at frit pattern exit location 144. The profile of the laser power as it is increased between 156 and 160 is advantageously depicted in FIG. 7 as a linear increase. The invention should not be construed as limited to a linear increase, however. Any profile can be used so long as the heating rate of change vs. distance doesn't exceed about 112° C./mm.

It can be seen that the position at which the laser 132 first reaches target power 192 is located in the retrace section of the frit pattern, but after the position at which the laser power begins its decrease from target power. This is referred to as a overlap. The overlap is advantageous to avoid raising the temperature of the frit to temperatures, e.g., about 500° C., which might lead to additional residual stress.

Although FIGS. 5 and 7 both indicate linear and equal rates of laser power increase and decrease per unit distance, it should be understood that multiple linear, non-linear and unequal rates of change, i.e., unequal as between rate of increase and rate of decrease, are within the teaching of the present invention. Thus, for example, the rate of increase or decrease of laser power may have more than one discrete linear rate or may not be linear at all. In addition, distance over which the laser power is increased may be less than, equal to or greater than the distance over which the laser power is decreased.

Figure 8:
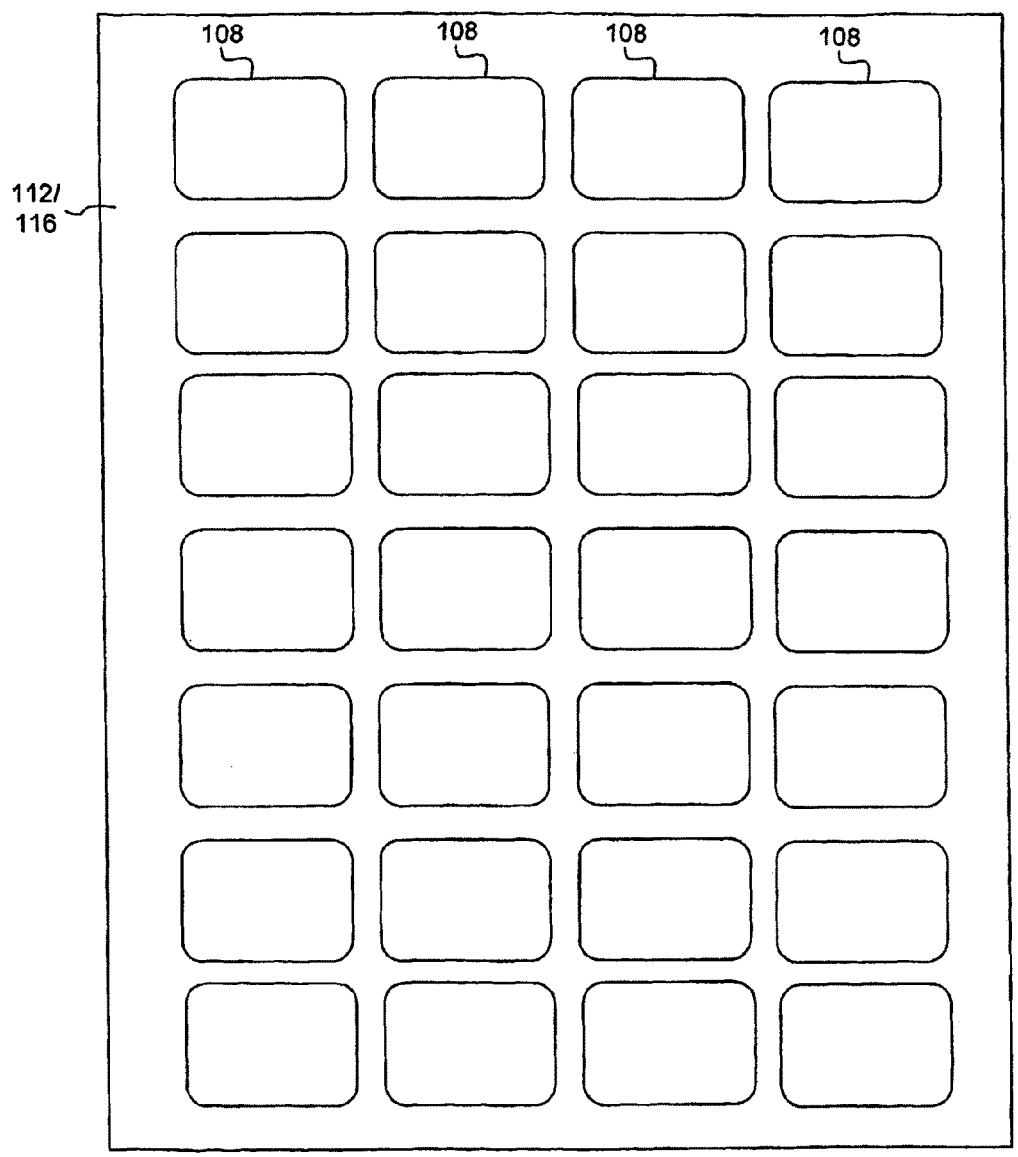
FIG. 8 is a plan view of multiple frit patterns 108 sandwiched between substrate plates 112 and 116.

It should be noted that, although the OLED displays 100 of the present invention are shown as single OLED displays in FIGS. 1, 4 and 6, in commercial practice, several OLED displays are formed on a single substrate plate such as depicted in FIG. 8. The OLED displays 100 can be sealed and then cut into individual displays.

In an advantageous embodiment of the present invention, frit pattern 108 entry points 140 and exit points 144 are located on the frit patterns in such a way as to minimize the "off frit pattern" movement of the laser, i.e., the movement of the laser between individual frit patterns This helps to minimize the time it takes to seal multiple OLED displays 108.

Although specific embodiments of the invention have been discussed, a variety of modifications to those embodiments which do not depart from the scope and spirit of the invention will be evident to persons of ordinary skill in the art from the disclosure herein. The following claims are intended to cover the specific embodiments set forth herein as well as such modifications, variations, and equivalents.

We claim:

1. A method for manufacturing a hermetically sealed package comprising:
    traversing a closed path over a surface of a glass assembly comprising first and second glass plates with a laser beam to heat a frit disposed between the first and second plates, wherein traversing the closed path comprises the steps of:
    a) providing the laser beam at an initial laser power that is insufficient to heat the frit to form a hermetic seal;
    b) increasing the laser power from the initial laser power at a first location to a target laser power at a second location downstream from the first location relative to a direction of the traverse about the closed path, wherein the target laser power is at least sufficient to cause the frit to form a hermetic seal;
    c) maintaining the laser beam at the target laser power while the laser beam completes traversing the closed path to the first location;

d) maintaining the laser beam at the target laser power while the laser beam continues to traverse downstream past the first location to a third location downstream from the first location relative to the direction of traverse; and then
e) decreasing the laser power from the third location until the laser power is insufficient to heat the frit to form a hermetic seal at a fourth location, a predetermined distance downstream from the third location relative to the direction of traverse, wherein the heating melts the frit and seals the glass assembly to form a hermetically sealed package.

2. The method of claim 1 wherein the distance between the first location and the second location, over which the laser power is increased, is at least about 3 mm in length.

3. The method of claim 1 wherein the distance between the third location and the fourth location, over which the laser power is decreased, is at least about 5 mm in length.

4. The method of claim 1, wherein the third location is located either at the second location or downstream of the second location relative to the direction of traverse.

5. The method of claim 1, wherein the third location is located upstream of the second location relative to the direction of traverse.

6. A method for manufacturing a hermetically sealed package comprising:
   traversing a closed path over a surface of a glass assembly comprising first and second glass plates with a laser beam to heat a frit disposed between the first and second plates, wherein traversing the closed path comprises the steps of:
   a) providing the laser beam at an initial laser power that is insufficient to heat the frit to form a hermetic seal;
   b) increasing the laser power from the initial laser power at a first location to a target laser power at a second location downstream from the first location relative to a direction of the traverse about the closed path, wherein the target laser power is at least sufficient to cause the frit to form a hermetic seal;
   c) maintaining the laser beam at the target laser power while the laser beam completes traversing the closed path to the first location; and then
   d) decreasing the laser power from the first location until the laser power is insufficient to heat the frit to form a hermetic seal at a third location, a predetermined distance downstream from the first location relative to the direction of traverse, wherein the heating melts the frit and seals the glass assembly to form a hermetically sealed package.

7. The method of claim 6 wherein the distance between the first location and the second location, over which the laser power is increased, is at least about 3 mm in length.

8. The method of claim 6 wherein the distance between the first location and the third location, over which the laser power is decreased, is at least about 5 mm in length.

* * * * *